United States Patent [19]
Wilhelm et al.

[11] Patent Number: 5,742,133
[45] Date of Patent: Apr. 21, 1998

[54] DRIVER CIRCUIT FOR AN LED

[75] Inventors: Wilhelm Wilhelm; Johann Wuertele, both of München, Germany

[73] Assignee: Siemens Aktiengesellschaft, Munich, Germany

[21] Appl. No.: 711,020

[22] Filed: Sep. 9, 1996

[30] Foreign Application Priority Data

Sep. 7, 1995 [DE] Germany ............... 195 33 116.8

[51] Int. Cl.$^6$ ............... H03K 3/01; H03K 5/01
[52] U.S. Cl. ............... 315/291; 315/200 A; 307/109; 372/38; 362/800
[58] Field of Search ............... 315/200 A, 207, 315/291; 250/552; 362/800; 372/38; 340/825.82; 327/108, 109

[56] References Cited

FOREIGN PATENT DOCUMENTS 0123483  5/1989  Japan ............... 372/38

*Primary Examiner*—Robert Pascal
*Assistant Examiner*—Arnold Kinkead
*Attorney, Agent, or Firm*—Herbert L. Lerner; Laurence A. Greenberg

[57] ABSTRACT

A driver circuit for an LED includes a switch device being connected to the LED, being controlled by an input signal, and having a current source circuit. The switch device short-circuits the LED after a transition to a first switching state, and the switch device supplies the LED from the current source circuit after a transition to a second switching state, causing a higher current to flow initially and causing a lesser current to flow after a predetermined time period has elapsed.

9 Claims, 1 Drawing Sheet

DRIVER CIRCUIT FOR AN LED

BACKGROUND OF THE INVENTION

Field of the Invention

The invention relates to a driver circuit for an LED. In order to convert electrical signals into optical signals, either laser diodes or light-emitting diodes (LEDs) are used. The latter, while being distinguished by greater stability, nevertheless are much slower than laser diodes. In order to enable operating LEDs at data rates of more than 100 Mbit/sec, switching currents in a switching event must be offered at excessive levels. That is true for both turning them on and turning them off. Upon turning them off, the diode is triggered with reversed polarity for that purpose. However, that means that a current must be impressed in both directions through the LED. Typically, a bridge circuit is used to switch over the current direction, with a fixed supply voltage. However, in the bridge circuit two switches in series with the LED are needed. If 0.9 V are assumed for a switch and 2.2 V for the diode, then the supply voltage must be at least 4 V. In many cases, however, only lower supply voltages are available.

SUMMARY OF THE INVENTION

It is accordingly an object of the invention to provide a driver circuit for an LED, which overcomes the hereinafore-mentioned disadvantages of the heretofore-known devices of this general type and in which a high data rate is assured, despite a lower supply voltage.

With the foregoing and other objects in view there is provided, in accordance with the invention, a driver circuit for an LED, comprising a switch device being connected to an LED, being controlled by an input signal, and having a current source circuit; the switch device short-circuiting the LED after a transition to a first switching state, and the switch device supplying the LED from the current source circuit after a transition to a second switching state, causing a higher current to flow initially and causing a lesser current to flow after a predetermined time period has elapsed.

In accordance with another feature of the invention, the current source circuit includes a first transistor having a control terminal and having a load path connected in series with the LED; a first current limiting element connected between the control terminal of the first transistor and a reference potential; a second transistor having a control terminal and having a load path connected between the control terminal of the first transistor and a first supply potential; a resistor connected between the control terminal of the second transistor and a reference potential; a controllable current source connected between the control terminal of the second transistor and the reference potential; and a third transistor having a load path connected between the control terminal of the second transistor and the reference potential and having a control terminal connected to the control terminal of the first transistor; and there is provided a trigger device for adjusting the controlled current source as a function of the input signal to a maximal value during a first switching state or phase and initially for the predetermined time period to a medium value and then to a minimal value during a second switching state or phase.

In accordance with a further feature of the invention, the switch device has a fourth transistor being operated as an emitter follower in combination with the current source circuit, the fourth transistor having a load path connected parallel to the LED and being triggered to be at least initially conducting during the first switching state and to be blocked during the second switching state.

In accordance with an added feature of the invention, the fourth transistor is supplied by a second supply potential and has a control terminal, the fourth transistor being triggered at least initially during the first switching state by a higher potential applied to the control terminal of the fourth transistor than the second supply potential supplying the fourth transistor.

In accordance with an additional feature of the invention, there is provided a diode connected in the forward direction between the second supply potential and the control terminal of the fourth transistor; a capacitor and a second current limiting element following the capacitor in series with a node point therebetween, the capacitor and the second current limiting element being connected between the diode and the reference potential; and a fifth transistor having a load path connected between the second supply potential and the node point, the fifth transistor being made conducting by the trigger device as a function of the input signal during the first switching state and otherwise being blocked.

In accordance with yet another feature of the invention, the fifth transistor is operated as an emitter circuit in combination with the second current limiting element.

In accordance with yet a further feature of the invention, there is provided a constant current source connected parallel to the current source circuit.

In accordance with yet an added feature of the invention, all of the transistors are of the same conduction type.

In accordance with yet an additional feature of the invention, the first and second supply potentials are identical.

Instead of reversing the polarity of the LED, it is proposed according to the invention that the LED be short-circuited at low impedance, in order to accomplish a rapid discharge of the charge stored in the LED. Thus there is only one switch in series with the LED, the total voltage drop is less and accordingly the supply voltage can be set lower.

In accordance with a concomitant feature of the invention, the current source circuit supplying the LED has only a single transistor in series with the LED, through the use of which three different intensities are impressed, depending on the triggering.

Other features which are considered as characteristic for the invention are set forth in the appended claims.

Although the invention is illustrated and described herein as embodied in a driver circuit for an LED, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
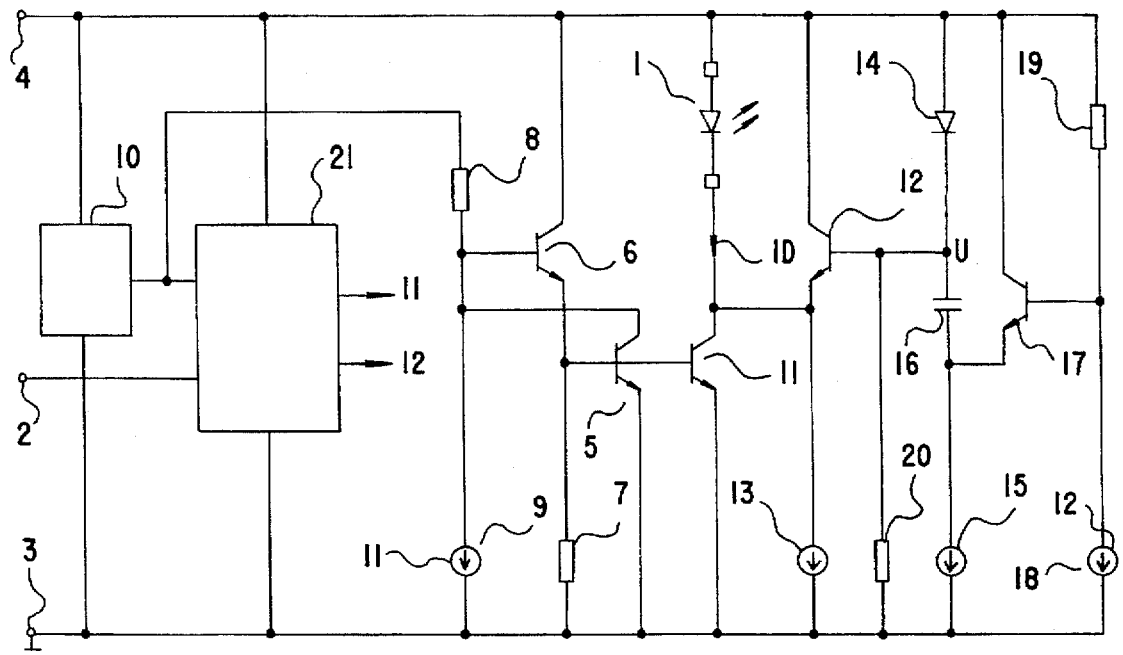
FIG. 1 is a schematic and block circuit diagram of an embodiment of a driver circuit according to the invention.

Referring now to the figures of the drawings in detail and first, particularly, to FIG. 1 thereof, there is seen an exemplary embodiment of a driver circuit according to the invention in which an LED 1 is turned on and off in accordance with an input signal 2. In the ON-state, the LED 1 is supplied by a current source circuit, while in the OFF state it is short-circuited. In the simplest case, a reversing switch which is provided for this purpose connects one terminal of the LED 1 in the ON state to one terminal of the current source circuit having another terminal that is connected to the other terminal of the LED 1, and in the OFF state couples the one terminal of the LED 1 to the other terminal of the current source circuit. An outflow of the charge stored in the LED 1 and thus faster turning off is enabled by the short-circuiting of the LED 1 in the OFF state. In order to attain faster turning on of the LED 1 as well, after the transition from the OFF to the ON state, first a stronger current and then, after a certain period of time has elapsed, a weaker current, are supplied to the LED 1.

In order to effect a further reduction in the voltage drop in series with the LED 1, according to a further feature of the invention the reversing switch is divided into two individual switches, one of which is intended for short-circuiting the LED 1 and the other of which is intended for turning on a current source that supplies the LED 1. The switch intended for turning on the current source that supplies the LED 1, and the current source itself, are replaced by a controllable current source configuration, in which one maximal, one medium and one minimal current can be generated, depending on the triggering. The minimal current may also be equal to zero.

Referring to FIG. 1 in greater detail, it is seen that the controlled current source configuration includes, for instance, a first transistor 11 having a load path which is connected in series with the LED 1. To that end, one terminal of the LED 1 is connected to a supply potential 4 and another terminal thereof is connected to a collector of the transistor 11. An emitter of the transistor 11, as well as an emitter of a third transistor 5, are connected to a reference potential 3. Bases of the two transistors 11 and 5 are connected to one another, to an emitter of a second transistor 6 and to a terminal of a resistor 7. The resistor 7 serves as a first current limiting element and has another terminal connected to the reference potential 3. The transistor 6 has a collector which is connected to the supply potential 4 and a base which is connected to one terminal of a controllable current source 9, to a collector of the transistor 5 and to one terminal of a resistor 8. Another terminal of the resistor 8 is coupled to a reference voltage source 10, which is connected to the supply potential 4 and the reference potential 3 in order to supply voltage. The current source 9 is controlled by a trigger circuit 21 and has another terminal to which the reference potential 3 is applied. The supply potential 4 and the reference potential 3, as well as both a reference voltage generated by the reference voltage source 10 and the input signal 2, are delivered to the trigger circuit 21.

Accordingly, in this further feature of the invention, instead of one transistor each for switching and impressing current, only a single transistor 11 is used. Moreover, in a departure from the conventional structure, the transistor 11 is connected to the reference potential 3 directly on the emitter side, without current limiting elements in the emitter circuit. As a result, the voltage drop between the LED 1 and the reference potential 3 is reduced to a minimum. The collector current of the parallel transistor 5 is monitored in order to monitor the collector current of the transistor 11 and therefore they should be adapted to one another. In order to avoid additional power loss, the emitter surface area of the transistor 5 is selected to be substantially smaller than that of the transistor 11.

Another further feature of the invention provides for short-circuiting of the LED 1 through the use of a fourth transistor 12 in the OFF state. The transistor 12 is operated as an emitter follower in conjunction with the load path of the transistor 11, in such a way that a collector of the transistor 12 is connected to the supply potential 4, and its emitter is connected to the collector of the transistor 11. A constant current source 13 which is connected parallel to the load path of the transistor 11 can also be provided for the case where the minimal current through the transistor 11 is equal to zero. Thus current source is necessary in the case where the transistor 12 is operated as an emitter follower. However, discharging of the LED 1 by an emitter follower as a switch only works, with a sufficiently small voltage drop across the switch, whenever the base of the emitter follower transistor is raised above the collector potential of that transistor. To that end, a capacitor 16 is charged during the ON state through a diode 14 and a constant current source 15 as the current limiting element. The diode 14 is connected in the forward direction on one hand to the supply potential 4 and on the other hand to a base of the transistor 12. The constant current source 15 is connected on one hand to the reference potential 3 and on the other hand to one terminal of the capacitor 16. The capacitor 16 has another terminal which is connected to the base of the transistor 12. A fifth transistor 17 which is also provided has an emitter that is connected to a node point between the capacitor 16 and the constant current source 15 and a collector to which the supply potential 4 is applied. In the ON state of the LED 1, the transistor 17 is blocked. Conversely, in the OFF state of the LED 1, the transistor 17 is made conducting, and thus the node point between the capacitor 16 and the constant current source 15 is brought to nearly the supply potential 4. Due to the voltage across the capacitor 16, a node point between the capacitor 16 and the diode 14, and thus the base of the transistor 12, is raised to a potential which exceeds the supply potential 4 by the voltage across the capacitor 16. This assures that the transistor 12 is made fully conducting, and its emitter potential reaches nearly to the supply potential 4. Thus the LED 1 is discharged with the least possible impedance. The transistor 17 is controlled by the trigger circuit 21, through the use of a controllable current source 18. To that end, the current source 18 is connected between a base of the transistor 17 and the reference potential 3. A resistor 19 is also placed between the base of the transistor 17 and the supply potential 4, for generating a bias voltage at the base of the transistor 17. Finally, a resistor 20 is connected between the base of the transistor 12 and the reference potential 3 in order to assure a defined input impedance and therefore a defined discharge resistance for the capacitor 16.

In the present exemplary embodiment, all of the transistors 5, 6, 11, 12, 17 are bipolar transistors of the npn type. An embodiment solely with transistors of the same type is advantageous particularly when the driver circuit is constructed by integrated circuitry. The use of npn bipolar transistors also has the advantage that they allow a higher emitter-to-collector current and are therefore more suitable than pnp types. Nevertheless, the circuit can also be realized with pnp bipolar transistors and with field effect transistors. In the case of the exemplary embodiment, the use of npn bipolar transistors means that the supply potential 4 is positive as compared with the reference potential 3, and accordingly the anodes of the LED 1 and of the diode 14 are connected to the supply potential 4.

Figure 2:
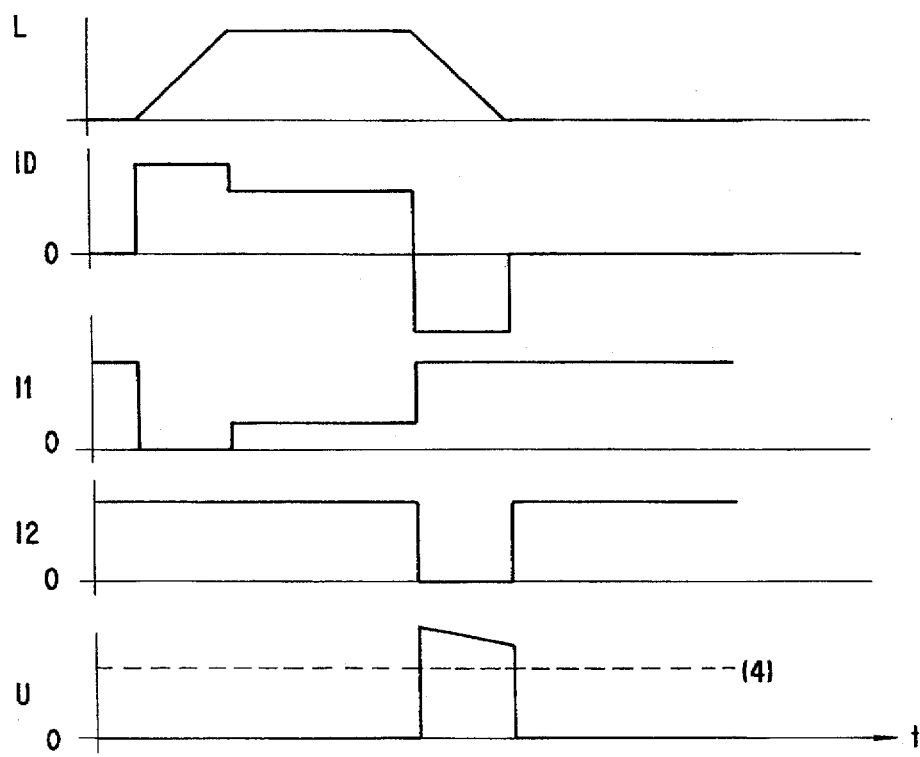
FIG. 2 is a graph showing the course of various signals in the exemplary embodiment of FIG. 1.

The controllable constant current sources 9 and 18 are controlled by the trigger circuit 21, for instance each through a respective control current I1 and I2, as a function of the input signal 2. FIG. 2 of the drawing shows one possible course of the control currents I1 and I2 over a time t. The currents generated by the controlled current sources 9 and 18 are proportional to the respective control current I1 and I2. Accordingly, up to a first time, the control current I1 has a maximal value, and after that until a second time it has a minimal value, which in the exemplary embodiment is equal to zero. Between the second time and a third time, a medium value between them is assumed, and finally after the third time a return to the maximal value is made. The control current I2 is set to a specified value other than zero until the third time. From the third time until a fourth time, it is equal to zero, and after that it is again equal to the specified value. The result for a potential U at the base of the transistor 12 is then a course in which up to the third time the potential U is equal to zero, at the third time it rises sharply beyond the supply potential 4, then drops slowly until the fourth time, when it drops sharply to zero and then stays there. The slowly dropping edge depends substantially on the capacitance of the capacitor 16 and on the resistor 20. Both the steepness and the duration of the slow drop can be selected arbitrarily, so that complete discharging of the charge stored in the LED 1 is assured.

In the case of a current ID flowing through the LED 1, the result is consequently a course in which the current ID up to the first time is equal to zero, from the first to the second time is equal to a maximal value, from the second to the third time is equal to a medium value, from the third to the fourth time is equal to a negative value, and finally after the fourth time is again equal to zero. A light output L produced by the LED 1 is initially equal to zero, then after the first time until the second time rises to a maximal value, and maintains that value until the third time. After that, until the fourth time, it drops down to zero again and remains at zero. A trigger signal 2 is based on such a light pulse, with the trigger signal changing, for instance, at the first time from a logic state L to a logic state H, maintaining that state until the third time, and thereafter dropping back to the logic state L. Proper operation of the LED down to a minimal supply voltage of 3.3 V, using currently conventional technology, is possible with the driver circuit shown in the exemplary embodiment.

We claim:

1. A driver circuit for an LED, comprising:

a switch device being connected to an LED, being controlled by an input signal, and having a current source circuit; said switch device short-circuiting the LED after a transition to a first switching state, and said switch device supplying the LED from said current source circuit after a transition to a second switching state, causing a higher current to flow initially and causing a lesser current to flow after a predetermined time period has elapsed; and said current source circuit, including:

a first transistor having a control terminal and having a load path connected in series with the LED;

a first current limiting element connected between the control terminal of said first transistor and a first reference potential;

a second transistor having a control terminal and having a load path connected between the control terminal of said first transistor and a first supply potential;

a resistor connected between the control terminal of said second transistor and a second reference potential;

a controllable current source connected between the control terminal of said second transistor and the first reference potential;

a third transistor having a load path connected between the control terminal of said second transistor and the first reference potential and having a control terminal connected to the control terminal of said first transistor; and a trigger device for adjusting said controllable current source as a function of the input signal to a maximal value during the first switching state and initially for the predetermined time period to a medium value and then to a minimal value during the second switching state.

2. The driver circuit according to claim 1, wherein said switch device has a fourth transistor being operated as an emitter follower in combination with said current source circuit, said fourth transistor having a load path connected parallel to the LED and being triggered to be at least initially conducting during the first switching state and to be non-conducting during the second switching state.

3. The driver circuit according to claim 2, wherein said fourth transistor is supplied by a second supply potential and has a control terminal, said fourth transistor being triggered at least initially during the first switching state by a higher potential applied to the control terminal of said fourth transistor than the second supply potential supplying said fourth transistor.

4. The driver circuit according to claim 3, including:

a diode connected in the forward direction between the second supply potential and the control terminal of said fourth transistor;

a capacitor and a second current limiting element following said capacitor in series with a node point therebetween, said capacitor and said second current limiting element being connected between said diode and the first reference potential; and a fifth transistor having a load path connected between the second supply potential and said node point, said fifth transistor being made conducting by said trigger device as a function of the input signal during the first switching state and otherwise being non-conducting.

5. The driver circuit according to claim 4, wherein said fifth transistor is operated as an emitter circuit in combination with said second current limiting element.

6. The driver circuit according to claim 5, including a constant current source connected parallel to said current source circuit.

7. The driver circuit according to claim 4, wherein all of said transistors are of the same conduction type.

8. The driver circuit according to claim 3, wherein the first and second supply potentials are identical.

9. The driver circuit according to claim 4, wherein the first and second supply potentials are identical.

* * * * *